United States Patent [19]

Smith et al.

[11] Patent Number: 5,210,527

[45] Date of Patent: May 11, 1993

[54] PROGRAMMABLE SPIKE DETECTOR

[75] Inventors: Dewey W. Smith, Fridley; Thomas D. Stechmann, White Bear Lake, both of Minn.

[73] Assignee: Ceridian Corporation, Minneapolis, Minn.

[21] Appl. No.: 715,319

[22] Filed: Jun. 14, 1991

Related U.S. Application Data

[63] Continuation of Ser. No. 372,731, Jun. 28, 1989, abandoned.

[51] Int. Cl.$^5$ .............................................. G08B 21/00
[52] U.S. Cl. ........................................ 340/659; 340/661; 307/360
[58] Field of Search ............... 340/659, 660, 661, 662, 340/663; 307/360, 361, 362; 361/90, 91, 92

[56] References Cited

U.S. PATENT DOCUMENTS

| | | | |
|---|---|---|---|
| 3,482,170 | 12/1969 | Ananiades et al. | 328/116 |
| 4,069,432 | 1/1978 | Bazin | 307/357 |
| 4,115,731 | 9/1978 | Axtell, III | 324/52 |
| 4,472,680 | 9/1984 | Wellington | 307/360 X |
| 4,535,294 | 8/1985 | Ericksen et al. | 328/150 |
| 4,563,641 | 1/1986 | Vitek et al. | 340/661 X |
| 4,587,444 | 5/1986 | Emori et al. | 307/355 |
| 4,677,388 | 6/1987 | Morrison | 328/150 |
| 4,789,836 | 12/1988 | May | 328/117 |

FOREIGN PATENT DOCUMENTS

1605019 12/1981 United Kingdom ................ 307/362

*Primary Examiner*—Jin F. Ng
*Assistant Examiner*—Jeffery A. Hofsass
*Attorney, Agent, or Firm*—Kinney & Lange

[57] ABSTRACT

A programmable spike detector is designed to detect spikes in a test signal in a device under test. The spike detector includes a differential amplifier which provides a difference signal representing the difference in voltage between the test signal and an offset signal, which is the drive voltage for the device under test. A first comparator determines if the difference signal exceeds a first reference signal, and if so, provides an indication of a spike condition. A second comparator provides a second spike indication if the difference signal is less than a second reference signal. In one form of the invention, the reference signals are established under control of a programmable processor.

12 Claims, 5 Drawing Sheets

PROGRAMMABLE SPIKE DETECTOR

This is a Continuation of application Ser. No. 07/372,731 filed Jun. 28, 1989 (now abandoned).

BACKGROUND OF THE INVENTION

Voltage spikes can occur in electrical apparatus. In computers, voltage spikes can be caused by hardware or software. Testing for the cause of voltage spikes is not a simple task, as a spike can result from reflection due to the connection of an unmatched load from the device under test ("DUT") or the pin under test ("PUT") to the tester. Oscilloscopes, storage scopes, and logic analyzers have been used to detect voltage spikes produced during circuit tests.

One problem with oscilloscopes is that they display a waveform of the signal in real time. Since voltage spikes are of short duration, it is not feasible to visually detect them. Further, voltage spikes may go undetected due to lack of sensitivity of the oscilloscope or lack of diligence of the operator. Also, it is often difficult to determine the cause of the voltage spike with an oscilloscope.

Storage scopes are expensive, and require triggering at the proper time so that the spike is captured during the storage time. Improved storage scopes digitize the data and record the digitized signal in memory for later readout, but such devices are often prohibitively expensive. Another problem with digital storage scopes is that low signal resolution render short duration spikes undetectable.

Logic analyzers are also not altogether suitable for voltage spike detection, the principal disadvantage being that the maximum differential voltages which can be measured are too small for many applications.

There is a need for an economical voltage spike detector device which can be attached to the device under test during the entire test period of testing and which can handle a wide range of voltage differentials. There is also a need for an economical voltage spike detector which can detect a spike regardless of signal resolution or operator error.

SUMMARY OF THE INVENTION

Apparatus according to the present invention includes at least two buffers, one for a test signal and one for an offset signal. The output of the buffers are provided to a differential amplifier which provides a differential signal based on the difference between the test and offset signals. A comparator compares the differential signal to a reference signal to produce an output if the differential signal exceeds the value of the reference signal.

Preferably, the output of comparator operates a storage device, such as a flip-flop, which in turn operates an indicator.

In operation of the apparatus according to the present invention, the offset signal is set to the voltage level of the device under test, and the differential amplifier determines the amount that the test signal from the device varies from the offset signal. For example, if the voltage driving the device under test is set at +5.0 volts, the differential amplifier output will be an analog signal having an instantaneous value representing the amount that the test signal varies from the drive (offset) voltage. If the value of the analog output of the differential amplifier exceeds a design level (established by the reference signal to the comparator), a spike condition is assumed to occur. The apparatus according to the present invention detects a voltage spike regardless of the signal resolution and which is not dependent on triggering apparatus or an operator's visual skills. The apparatus can also be used to aid in isolating a spike, thereby making correction of the cause of such spike easier.

In one form of the invention, there are two comparators each receiving the differential signal and a different reference signal. One of the comparators detects positive voltage spikes, and the other detects negative voltage spikes.

BRIEF DESCRIPTION OF THE DRAWINGS

The above and other features of this invention will be more fully understood from the following detailed description and the accompanying drawings in which.

DETAILED DESCRIPTION OF THE PREFERRED EMBODIMENTS OF THE INVENTION

Figure 1:
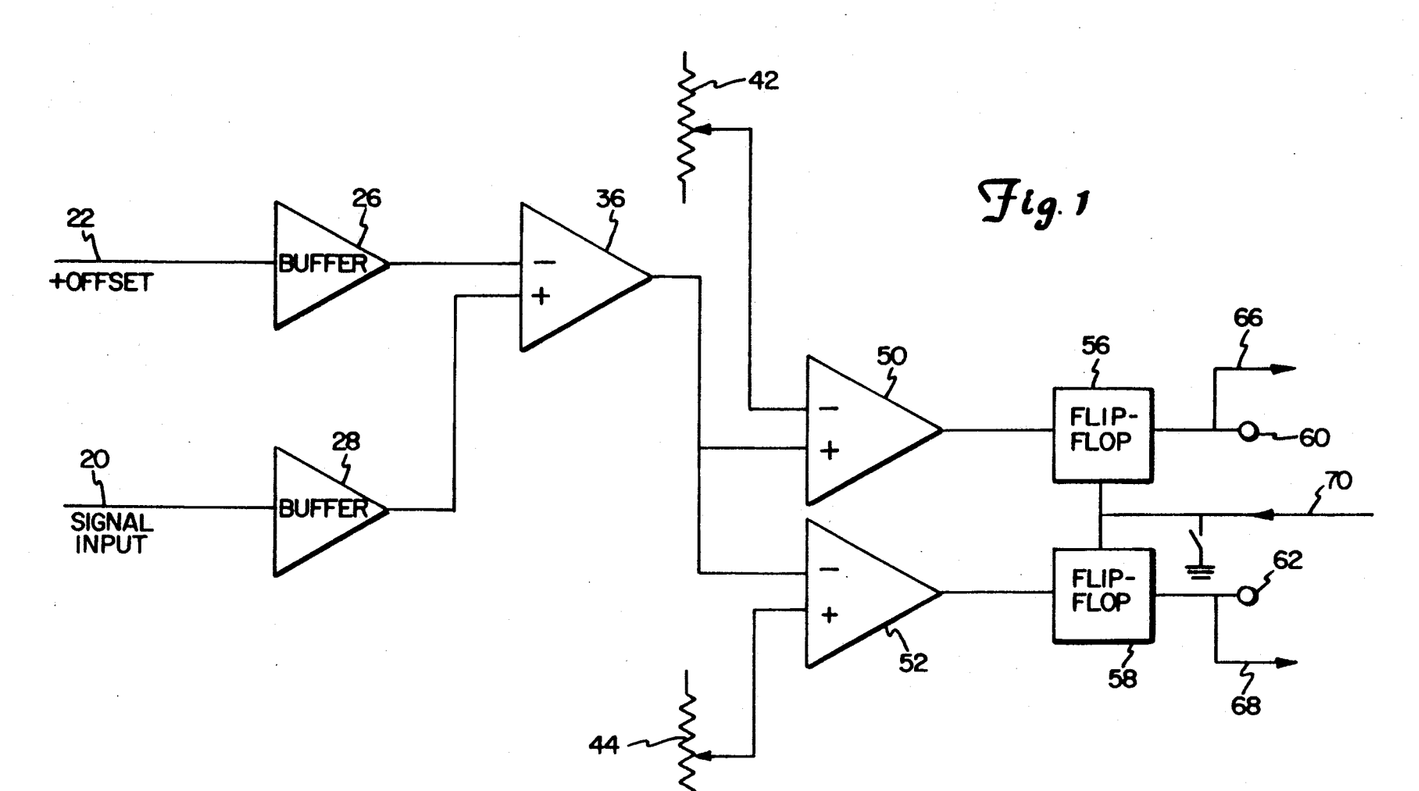
FIG. 1 is a schematic diagram of the presently preferred embodiment of the spike detector circuit according to the present invention.

FIG. 1 illustrates the presently preferred embodiment of a voltage spike detector in accordance with the present invention. Line 20 is connected to the device under test (not shown) and carries the signal which is to be tested for spikes. Line 22 is preferably also connected to the device under test and carries a signal (the offset signal) representative of the drive voltage to the device under test. The offset signal is a reference to be dynamically subtracted from the signal under test such that the difference is compared to the positive/negative reference. For example, the offset input may be connected to the VCC pin on the DUT so that voltage spikes on the signal input which exceed the offset signal on the VCC pin by greater than a predetermined amount (for example, 1.0 volts) will be detected.

Buffer 26 provides the offset signal on line 22 to one side of differential amplifier 36, and buffer 28 provides the signal under test on line 20 to the other side of differential amplifier 36. Buffer 26 and 28 are high speed, high impedance buffers which draw only a small current and have a minimum band width of 100 MHz.

Differential amplifier 36 provides a differential (analog) signal to comparators 50 and 52 based on the difference between the offset and test signals. More particularly, differential amplifier determines the amount that the signal under test on line 20 might exceed the offset signal on line 22, and provides the difference signal to comparators 50 and 52. Variable resistor, or potentiometer, 42 is connected to a voltage source to provide a first (high) reference voltage to comparator 50, and variable resistor, or potentiometer, 44 is connected to the voltage source to provide a second (low) reference voltage to comparator 52. Comparator 50 compares the differential output of the differential amplifier 36 to the first (high) reference voltage, whereas comparator 52 compares the differential output of the differential amplifier 36 to the second (low) reference voltage. If the differential signal from differential amplifier 36 exceeds the high reference voltage from potentiometer 42, comparator 50 operates flip-flop 56 to operate an indicator, such as LED 60, thereby indicating a positive spike has occurred. If the differential output of the differential amplifier 36 is lower than the low reference voltage from potentiometer 44, comparator 52 operates flip-flop 58 to operate an indicator, such as LED 62, thereby indicating a spike has occurred negatively of the offset on line 22.

Lead 66 is connected to the line between flip-flop 56 and LED 60 and lead 68 is connected to the line between flip-flop 58 and LED 62. Reset line 70 provides a reset signal to flip-flops 56 and 58 for resetting the flip-flops after a spike has been detected.

Figure 5:
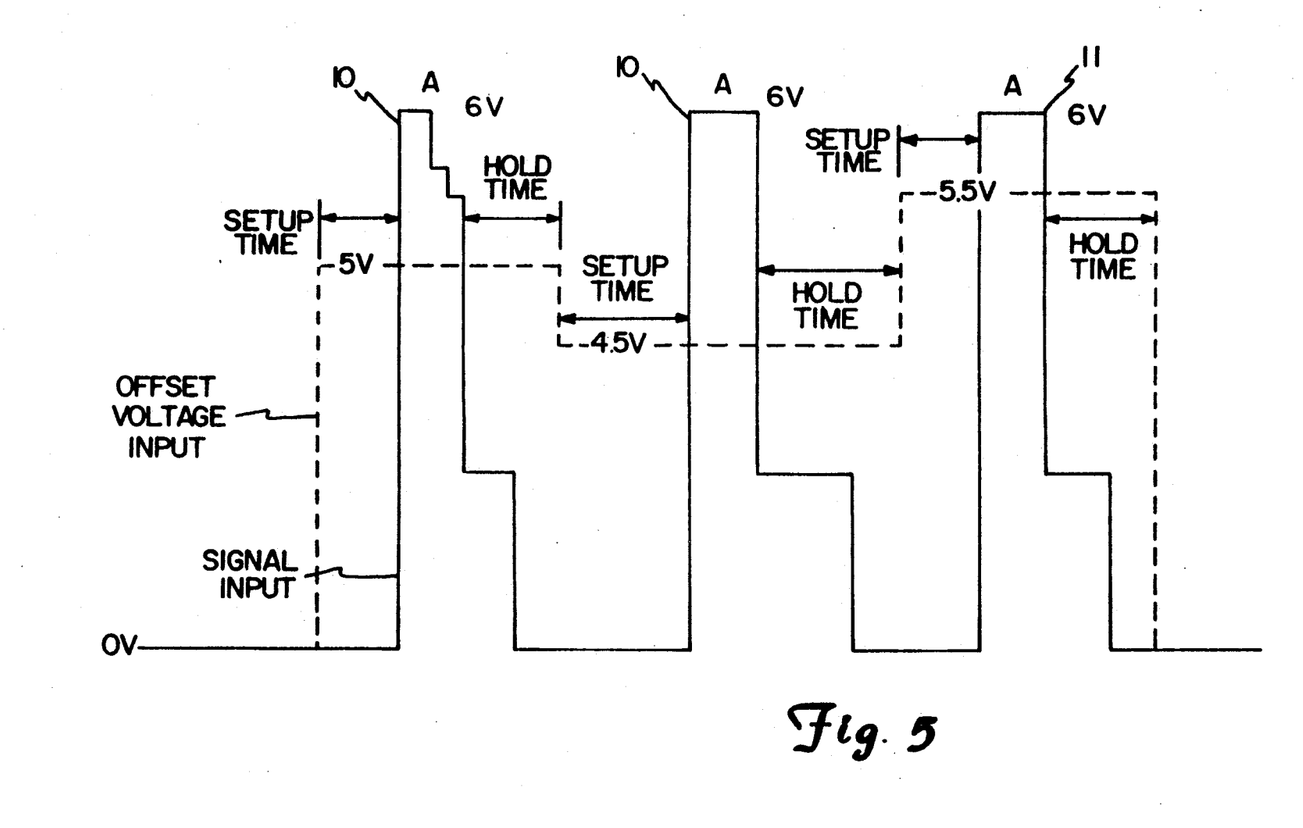
FIG. 5 is a time versus voltage graph illustrating detection of spikes.

FIG. 5 is a diagram illustrating the voltage levels of both the offset and test signals. As shown in FIG. 5, the offset voltage, which is typically set to the power pin (VCC) of the DUT (Device Under Test), might vary over time. The offset voltage in FIG. 5 is shown as varying between 4.5 and 5.5 volts. Test signal inputs are shown in FIG. 5 as reaching 6.0 volts.

If the offset voltage from the VCC (DUT Power Pin) and the test signal voltage connected to one of the DUT input pins were both equal to 5.0 volts, the output of differential amplifier 36 would be 0 volts. Hence, a 0 volts input to comparators 50 and 52 would be less than the high reference level of comparator 50 and greater than the low reference level of comparator 52, as to not flag a spike. However, if the input signal had a peak which exceeded the offset signal, that peak would be detected as a voltage spike only if the peak exceeded the offset level by an amount established by the high reference level on comparator 50. For example, if potentiometer 42 set the high reference level at +1.0 volts and the input peaked at 6.0 volts, voltage spikes would only be detected at spikes 10 where the input peaks exceeded the offset signal by one volt or more. Peak 11 would not indicate a spike because there the 6.0 volt peak exceeded the 5.5 volt offset by less than the one volt reference.

As illustrated in FIG. 5 the offset voltage input can be varied or programmed over time. Thus, the offset voltage is shown to vary from 0 to 5.0, 4.5 and back to 5.5 volts. These changes correspond to different levels of the signal input. Usually, the signal input is a desired increment less than the offset voltage, and the present apparatus detects spikes in the signal input which exceed that increment. FIG. 5 is also useful in showing the setup time and hold time associated with each new level of the offset voltage. The setup time is the amount of time necessary for the offset voltage to stabilize before a spike can be detected. The hold time is the time that the offset input must be retained in order to detect a spike. The time between the setup time and the hold time is the sample time in which a spike must occur in order to be detected.

To test for negative spikes with the apparatus illustrated in FIG. 1 it is necessary to make a second iteration of the test with the offset input lead 22 attached to the DUT ground pin or ground on the test fixturing and the reference voltage from potentiometer 44 set at the negative threshold of the spike. For example, to detect spikes more negative than −0.5 volts, the reference voltage from potentiometer 44 is set to −0.5 volts and comparator 52 operates flip-flop 58 and LED 62 when the reference voltage is more positive than the differential voltage. Three iterations may be required to test devices having both positive and negative power, the first iteration with offset lead 22 attached to positive power of the DUT to detect spikes greater than power (plus the reference), the second iteration with the offset lead 22 connected to ground to detect negative spikes, and the third iteration with the offset lead 22 used as the test signal input and the signal input lead attached to the negative power of the DUT to detect spikes more negative than the negative power (minus the reference). Thus, using the apparatus of FIG. 1 for detecting spikes, and performing two iterations of the test allows an operator to detect all spikes caused in a particular system.

Figure 2:
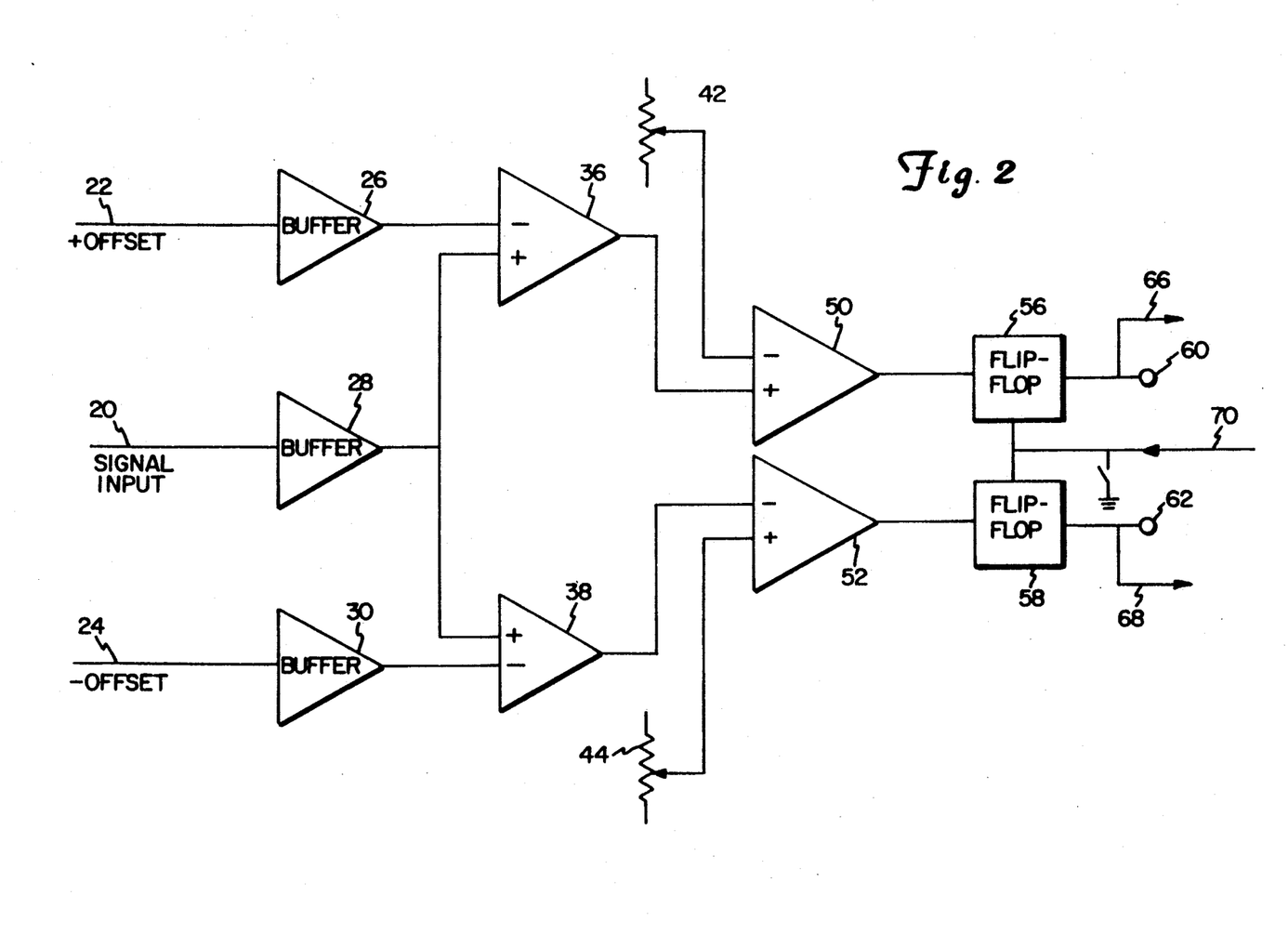
FIG. 2 is a schematic diagram of another embodiment of the spike detector circuit.

The apparatus illustrated in FIG. 2 eliminates the need for performing multiple iterations of the test on devices with positive and negative power. The apparatus illustrated in FIG. 2 is primarily the same as that show in FIG. 1, with the addition of an additional buffer 30 receiving the negative offset (-VCC) voltage from the test device on lead 24. Buffer 30 provides an output to differential amplifier 38, which receives its other input from buffer 28. Comparator 52, instead of receiving input from differential amplifier 36 at its negative input side, receives input from differential amplifier 38. Differential amplifier 38 provides a differential output representative of the amount that the test signal is more negative than the negative offset signal. Comparator 52 compares the differential output of differential amplifier 38 to a reference voltage from potentiometer 44. If the output of differential amplifier 38 exceeds the reference voltage produced by the potentiometer 44, comparator 52 produces a signal to flip-flop 58 which in turn operates LED signal 62 thus indicating a negative spike.

The apparatus illustrated in FIG. 2 detects both positive and negative spikes during a single sequence of the test, and does not require rewiring the test arrangement as in FIG. 1. For example, assume the positive and negative offset signals (VCC and minus VCC of the device under test, respectively) are at +4.0 and −4.0 volts, respectively, and the potentiometers 42 and 44 are set to provide reference voltages of +1.0 and −1.0 volts, respectively. The circuit illustrated in FIG. 2 will operate to detect spikes when the input signal on line 20 is greater (more positive) than +5.0 volts or less than (more negative) than −5.0 volts. For example, if a voltage spike of +6.0 volts appears at the input on line 20, the input to differential amplifier 36 is +6.0 volts, which exceeds the offset signal by +2.0 volts, thereby providing a +2.0 volts signal to comparator 50. Comparator 50 determines that the +2.0 volts differential signal is greater than the +1.0 reference signal to operate flip-flop 56 and LED 60. Differential amplifier 38 determines the difference between the +6.0 volts spike and the −4.0 volts offset signal to produce a +10.0 volts differential output to comparator 52. Comparator 52 determines that the +10.0 differential signal is not more negative than the −1.0 volts reference signal, so flip-flop 58 and LED 62 are not operated.

If the spike is a negative spike, for example −6.0 volts, differential amplifier 38 determines that the input signal is more negative than the −4.0 volts negative offset signal to produce a −2.0 volts differential signal. Comparator 52 determines that the −2.0 differential signal is more negative than the −1.0 volt reference signal to operate flip-flop 58 and LED 68 to indicate a negative spike has occurred. Because the −6.0 volts spike is less than the +4.0 volts positive offset signal at differential amplifier 36, differential amplifier 36 provides a −10.0 volts differential signal to comparator 50 which is less than the +1.0 volts reference signal from potentiometer so flip-flop 56 and LED 60 are not operated. If the input signal is less than +5.0 volts (or greater than −5.0 volts), the apparatus of FIG. 2 will not indicate a spike.

Figure 3:
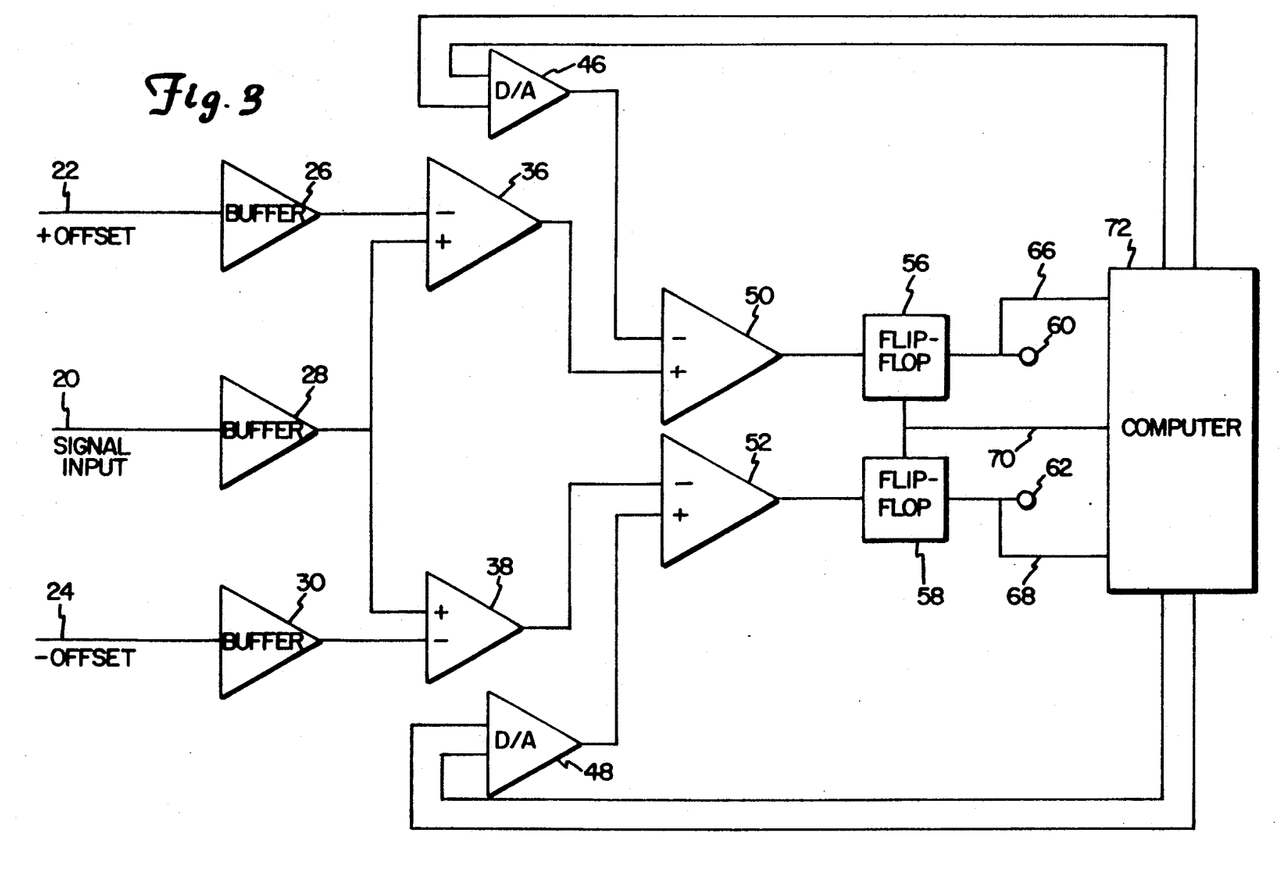
FIG. 3 is a schematic diagram of yet another embodiment of the spike detector circuit.

FIG. 3 illustrates another embodiment of the voltage spike detector according to the present invention. The apparatus illustrated in FIG. 3 is similar to the apparatus illustrated in FIG. 2, except that potentiometers 42 and 44 in FIG. 2 have been replaced with digital-to-analog converters 46 and 48, and leads 66 and 68 and reset line 70 are connected to computer 72. Computer 72 operates in response to detection of a positive negative spike (from a signal from either flip-flop 56 or 58 on line 66 or 68) to provide a reset on line 70 to the flip-flops. Further, the inputs to converters 46 and 48 may be operated under control of computer 72 to permit automatic adjustment of the reference signal voltages to comparators 50 and 52. Further, the apparatus of FIG. 3 is particularly useful as an aid to isolate the cause of a spike. Particularly, breaks can be programmed into the computer to repeat portions of the test program upon detection of a spike. By repositioning the breaks the cause of a spike may be isolated to a specific step in the software routine. A skilled operator may then determine the cause of the spike from the subroutine or step of the software causing the spike. With the apparatus illustrated in FIG. 3, the time of a spike can be determined and recorded within a few microseconds of its occurrence. The apparatus is automatically reset to be ready to detect another spike. Computer 72 records the time of occurrence of the spike, thereby easing the task of isolating the source of the spike.

Figure 4:
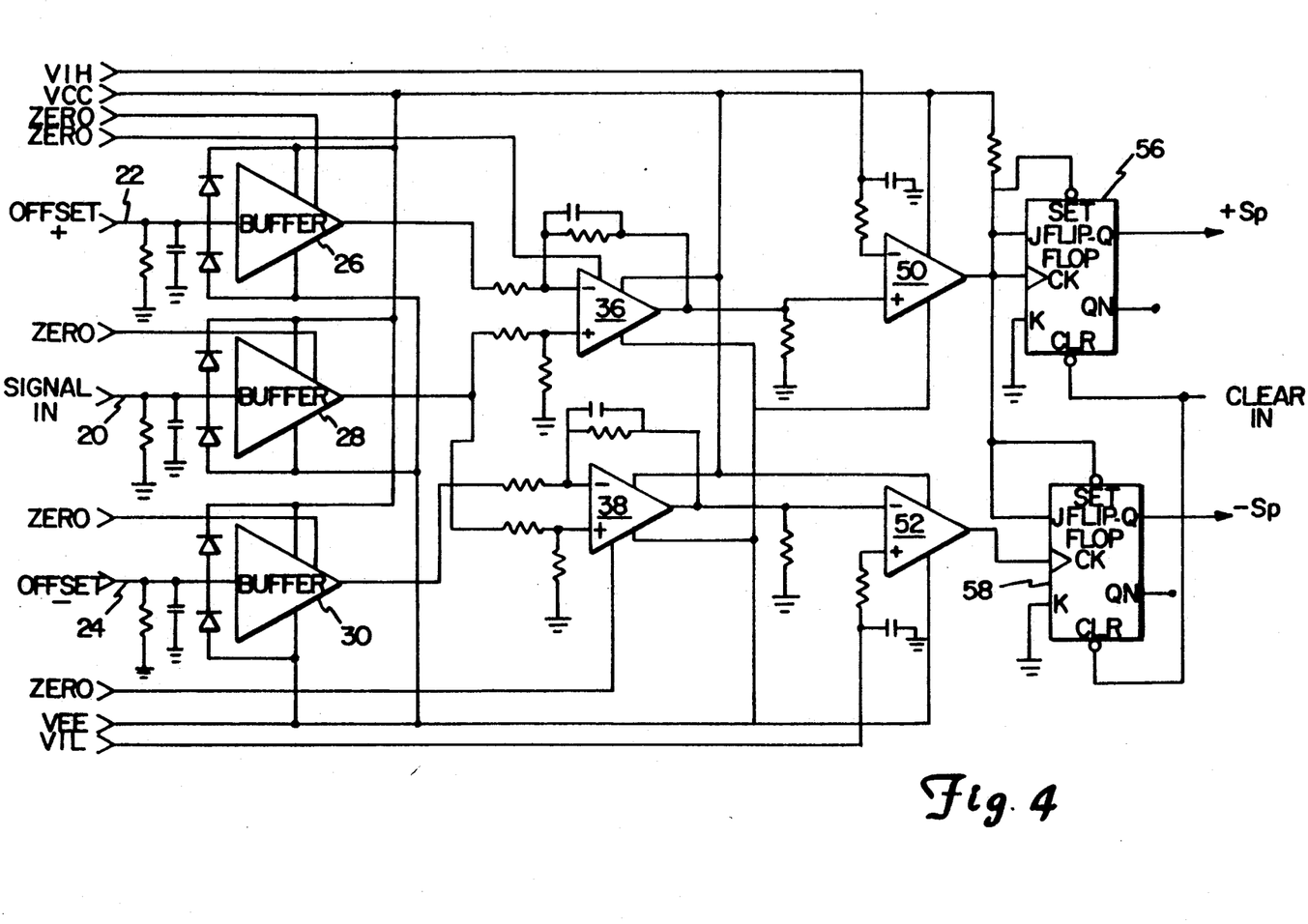
FIG. 4 is an circuit diagram of the spike detector circuit illustrated in FIG. 2.

FIG. 4 shows a more complete electrical diagram of the apparatus illustrated in FIG. 2. The principal elements described in connection with FIG. 2 are numbered; the remaining components such as resistors, diodes, and capacitors are evident to skilled circuit designer for balancing electrical loads and alternating the signal.

This invention is not to be limited by the embodiments shown in the drawings and described in the description, which are given by way of example and not of limitation, but only in accordance with the scope of the following claims:

What we claim is:

1. A spike detector to determine if a spike is present in an analog test signal in a circuit under test, the spike detector comprising:

a first input receiving the analog test signal from the circuit under test;

a second input receiving an analog offset signal from the circuit under test, the analog offset signal being independent of the test signal;

differential amplifier means connected to the first input and the second input and responsive to the analog offset signal and to the test signal for providing a differential signal representative of the difference between the values of the analog offset signal and the test signal;

reference means providing a reference signal having a preselected value;

comparator means responsive to the differential signal and the reference signal for providing an output signal when the value of the differential signal is greater than the value of the reference signal; and output means responsive to said output signal for indicating the presence of a spike in said test signal.

2. The spike detector according to claim 1 wherein said output means includes bistable means having first and second states, said bistable means being set to its first state in response to said output signal, and indicator means responsive to the first state of said bistable means to indicate the presence of a spike in said test signal, and reset means for resetting said bistable means to its second state.

3. The spike detector according to claim 2 wherein said reference means comprises a digital-to-analog converter, said reset means includes processor means responsive to the first state of said bistable means to set said converter and reset said bistable means.

4. The spike detector according to claim 3 wherein said processor is adapted to record the time of setting said bistable means to its first state.

5. The spike detector according to claim 1 further including second reference means providing a second reference signal having a preselected value; second comparator means responsive to the differential signal and the second reference signal for providing a second output signal when the value of the differential signal is less than the value of the second reference signal; said output means being responsive to aid second output signal for indicating the presence of a spike in said test signal.

6. The spike detector according to claim 1 wherein said analog offset signal has a positive value and said reference signal has a positive preselected value, said comparator means providing said output signal when the value of the differential signal is more positive than the value of the reference signal, the spike detector further including:

a third input receiving a second analog offset signal from the circuit under test, the second analog offset signal being independent of the test signal;

second differential amplifier means connected to the first input and the third input and responsive to the second analog offset signal and to the test signal for providing a second differential signal representative of the difference between the values of the second analog offset signal and the test signal;

second reference means providing a second reference signal having a preselected negative value;

second comparator means responsive to the second differential signal and the second reference signal for providing a second output signal when the value of the second differential signal is more negative than the value of the second reference signal; and said output means being further responsive to said second output signal for indicating the presence of a spike in said test signal.

7. The spike detector according to claim 6 wherein said output means includes first bistable means having first and second states, said first bistable means being set to its first state in response to said first named output signal, second bistable means having first and second states, said second bistable means being set to its first state in response to said second output signal, first indicator means responsive to the first state of said first bistable means to indicate the presence of a spike in said test signal, second indicator means responsive to the first state of said second bistable means to indicate the presence of a spike in said test signal, and reset means for resetting said first and second bistable means to their second state.

8. The spike detector according to claim 7 wherein said first named reference means comprises a first digital-to-analog converter and said second reference means comprises a second digital-to-analog converter, said reset means includes processor means responsive to the first state of either said first or second bistable means to set said first and second converters and reset said first and second bistable means.

9. The spike detector according to claim 8 wherein said processor means is adapted to record the time of setting said first bistable means to its first state and the time of setting said second bistable means to its first state.

10. The spike detector according to claim 9 wherein the value of the analog offset signal varies in time.

11. The spike detector according to claim 10 wherein said output means responds to indicate the presence of a spike in said test signal only when the analog offset signal is substantially stable.

12. The spike detector according to claim 1 wherein the reference signal is independent of the test signal.

* * * * *

UNITED STATES PATENT AND TRADEMARK OFFICE
CERTIFICATE OF CORRECTION

PATENT NO. : 5,210,527
DATED : May 11, 1993
INVENTOR(S) : DEWEY W. SMITH, THOMAS D. STECHMANN

It is certified that error appears in the above-identified patent and that said Letters Patent is hereby corrected as shown below:

Col. 6, line 26, delete "aid", insert --said--

Col. 8, line 4, delete "claim 9, insert --claim 1--

Signed and Sealed this

Twenty-first Day of December, 1993

Attest:

BRUCE LEHMAN

Attesting Officer     Commissioner of Patents and Trademarks